Oct. 20, 1964 D. J. SHOMBERT 3,153,731

SEMICONDUCTOR SOLID CIRCUIT INCLUDING AT LEAST TWO TRANSISTORS AND ZENER DIODES FORMED THEREIN

Filed Feb. 26, 1962

INVENTOR.
DONALD J. SHOMBERT

BY

ATTORNEY

United States Patent Office 3,153,731

Patented Oct. 20, 1964

3,153,731

SEMICONDUCTOR SOLID CIRCUIT INCLUDING AT LEAST TWO TRANSISTORS AND ZENER DIODES FORMED THEREIN

Donald J. Shombert, Berkeley Heights, N.J., assignor to Merck & Co., Inc., Rahway, N.J., a corporation of New Jersey Filed Feb. 26, 1962, Ser. No. 175,509

7 Claims. (Cl. 307—88.5)

This invention relates generally to semiconductor devices, and more particularly to a solid circuit semiconductor device providing a direct-coupled amplifier.

There are many known present uses for direct-coupled amplifiers utilizing semiconductor devices as active circuit elements. In the present state of the art, such circuits are traditionally constructed by utilizing a plurality of semiconductor active circuit elements such as transistors, Zener diodes, and the like, along with traditional circuit components such as resistors in order to construct a typical direct-coupled amplifier. Although such circuits are much smaller than those utilizing well known circuit components such as vacuum tubes, and the like, it is still apparent that such a semiconductor circuit is not completely compatible with present day techniques of micro-miniaturization. Thus, even though the traditional semiconductor circuit elements along with present day techniques of micro-miniaturization are utilized, there is still a relatively large waste of space.

In addition to the waste of space and the incompatibility above referred to, an additional problem, particularly when semiconductor elements made of silicon semiconductor material are utilized, is that of operational stability as temperature increases. That is, additional circuit components must be utilized along with the transistors and diodes to compensate for the change in characteristics of silicon transistors as temperature increases. Along with the temperature instability, which is inherent in a silicon semiconductor device, there is also the problem that where accurate stability is required it is often necessary to employ temperature ovens or the like so that all parts of the circuit are uniformly at the same temperature.

Accordingly, it is an object of the present invention to provide a direct-coupled amplifier using semiconductor circuit components and which is small rugged and is compatible with present day micro-miniaturization techniques.

Another object of the present invention is to provide a direct-coupled amplifier utilizing semiconductor circuit components in which the temperature of the various circuit components is maintained uniform throughout and which inherently embodies temperature stabilization characteristics.

It is another object of the present invention to provide a direct-coupled amplifier using semiconductor transistors in which the coupling is accomplished by the utilization of semiconductor junction breakdown characteristics developed within a solid semiconductor circuit structure.

A semiconductor solid circuit direct-coupled amplifier in accordance with the present invention includes at least two semiconductor transistors each having an emitter, a collector and a base. A semiconductor resistor is crystallographically interconnected with the emitter and a semiconductor material substrate. Crystallographically and electrically connected to at least one of the collectors of the two transistors is an additional layer of single crystalline semiconductor material which forms a very sharp junction with the collector of the transistor to which it is affixed. This layer of material is connected to the base of the other transistor. The normal power supply connections are made to the collectors of the two transistors and provision is made to apply the normal input signals and to remove the normal output signals from the amplifier structure.

Additional objects and advantages of the present invention both as to its operation and organization will become apparent from a consideration of the following description taken in conjunction with the accompanying drawings, in which.

Figure 1:
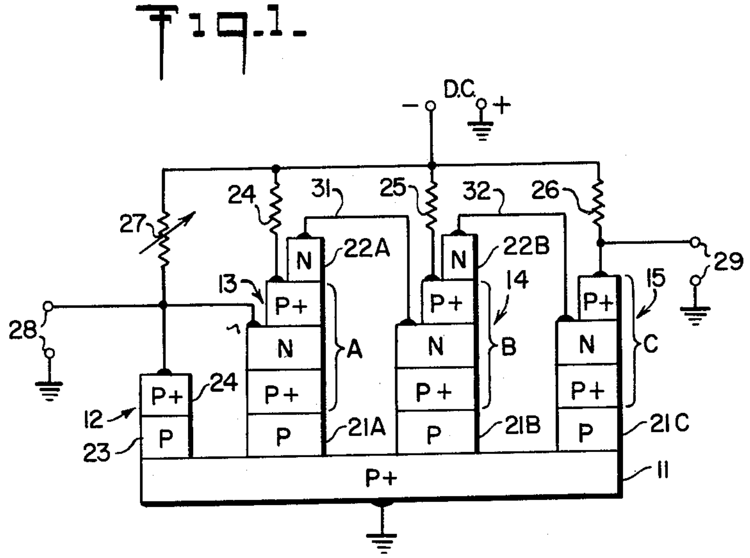
FIGURE 1 represents a schematic representation of a solid circuit semiconductor direct-coupled amplifier in accordance with the present invention.

Referring now more specifically to the drawing, and particularly to FIGURE 1 thereof, there is schematically illustrated a semiconductor solid circuit device in accordance with the present invention. The device may be constructed of any semiconductor material presently known to the art, and preferably is single crystalline semiconductor material. For example, the semiconductor device may consist of silicon, germanium, silicon-germanium alloy, silicon-carbide Group III–V inter-metallic compounds, such as gallium-arsenide, indium-phosphide, aluminum-antimonide, indium-antimonide, and the like. However, for purposes of deescription only, the following description of a semiconductor device in accordance with the present invention will be given with particular reference to the use of silicon as the semiconductor material.

Referring to FIGURE 1, there is illustrated in schematic diagram a semiconductor solid circuit direct-coupled amplifier in accordance with the present invention. As is therein illustrated, there is provided a substrate 11 of substantially single crystalline silicon semiconductor material. Affixed to the substrate 11 are four discrete members 12, 13, 14 and 15 each of which is constructed of silicon single crystalline semiconductor material. Within each of the members 13, 14 and 15 there is provided a transistor which is indicated by the bracketed layers of semiconductor material A, B and C within the members 13, 14 and 15, respectively. As is illustrated, the transistors are PNP type transistors. The lowermost layer in each case is the emitter, the uppermost layer in each case is the collector, while the central layer sandwiched between the emitter and collector of each of the three transistors is the N-type base for the transistor. Affixed between the emitters of each of the transistors A, B and C is a P-type semiconductor resistor which is also affixed to the substrate 11. The resistors are respectively indicated by the numeral 21A, 21B and 21C. Affixed to the collectors of the transistors A and B are additional layers of semiconductor material designated 22A and 22B, respectively. The resistivity of the semiconductor material contained in the layers 22A and 22B is chosen to form a very sharp PN junction with the P+ type collector region of each of the transistors A and B respectively. The purpose and use of the layers 22A, 22B and their respective PN junctions will be described more fully hereinafter.

The member 12 consists of a layer 23 of P type semiconductor material having a relatively high resistivity and a layer 24 of material which is P+. The layers 23 and 24 of material are the P+ type layer 24 being used to provide an ohmic connection to the layer 23 connected to the substrate 11 and provide a semiconductor resistor. Resistors 24, 25 and 26 are connected at one terminal thereof respectively to the collectors of transistors A, B and C and are interconnected at their opposite terminals and returned to the negative terminal of a source of direct current potential as illustrated by the letters B.C. A variable resistor 27 is connected between the layer 24 of semiconductor material and the negative terminal of the source of potential. Input terminals 28 are provided between the base of transistor A and ground as is illustrated, while output terminals 29 are provided between the collector of transistor C and ground as illustrated. A direct connection is provided by lead 31 between the layer 22A of semiconductor material and the base of transistor B. A similar direct connection is provided by lead 32 between the layer 22B of semiconductor material on transistor B and the base of transistor C.

From the foregoing description of the structure of a solid circuit semiconductor direct-coupled amplifier, it can be seen that three transistors A, B and C in conjunction with the emitter resistors 21A, 21B and 21C are interconnected through the substrate 11 to a source of fixed potential such as ground as illustrated, and therefore operate as common emitter amplifiers. The particular resistivity and dimensions of the resistors 21A, 21B and 21C are specifically chosen so that the transistors will so operate and so that each of the transistors is similarly oriented within the over-all circuit structure. The resistors formed by the layers 23 and 24 of semiconductor material are likewise so chosen as to provide the desired bias to the base of transistor A in conjunction with the variable resistor 27. The variable resistor 27 permits an adjustment of the circuit parameters to correct for any deviation that may occur during the construction of the solid circuit semiconductor structure. Likewise, the resistors 24, 25 and 26 are each utilized externally of the semiconductor material structure and may be individually chosen in order to accomplish the desired circuit orientation of each of the three transistors A, B and C to compensate for any slight deviation that may occur during the construction of the semiconductor device.

Referring now particularly to the layers 22A and 22B of semiconductor material which provide the sharp PN junction with the collectors of the transistors A and B, it can be seen as above described that the layers 22A and 22B are directly connected by leads 31 and 32 to the base of the next succeeding transistor, namely B and C, respectively. The resistivity of the layers of N-type semiconductor material 22A and 22B is chosen specifically to obtain the operation of a Zener diode having a predetermined breakdown voltage in conjunction with the P+ type material formed as the collector of the transistors A and B, respectively. By thus choosing the resistivity of the layers 22A and 22B, a specific voltage drop can be obtained across the junction formed between the collector of each of the two transistors and the layers 22A and 22B of N-type material. The voltage thus dropped during the operation of the layers 22A and 22B zener diodes provides a very important function for a micro-miniaturized circuit such as that in accordance with the present invention. A single power supply source may be utilized for the potential applied to the collectors of each of the transistors and to the base of each of the transistors in order to obtain the desired operation. Thus, assuming for purposes of example only, that a 10 volt bias is desired at the collector of each of the transistors and that the N-type layers 22A and 22B are designed to have an 8 volt Zener breakdown. The 8 volts is dropped across the junction provided as above described and will thus apply a direct current potential of 2 volts to the next succeeding base of the two transistors B and C as illustrated in FIGURE 1. In this manner, so long as the Zener diode layer is chosen to have the desired resistivity and junction characteristics with the collector of the transistor to which it is affixed, the desired biasing potentials are automatically applied to both the collector and the base of each of the respective transistors. At the same time, the reverse biased breakdown Zener diode type junction which is so supplied will provide a short circuit or direct connection for alternating current signals that may be applied through input terminals 28 to the base of transistor A.

The particular structure as illustrated in FIGURE 1 therefore may be viewed in the following manner with respect to the members 13 and 14. Transistors A and B are provided by the three layers of P+ N P+ material; a Zener diode which is reversed biased and operated in its Zener breakdown voltage characteristic region is provided by the upper P+ layer and the N-type layer 22A and the sharp junction therebetween. There is thus a dual function provided by the upper P+ layer, that of collector for transistor A or B and that of one portion of an effective Zener diode. Along with these two active circuit elements there is provided a passive circuit element, namely, the semiconductor P-type resistor indicated by semiconductor material layers 21A and 21B.

Figures 2, 3:
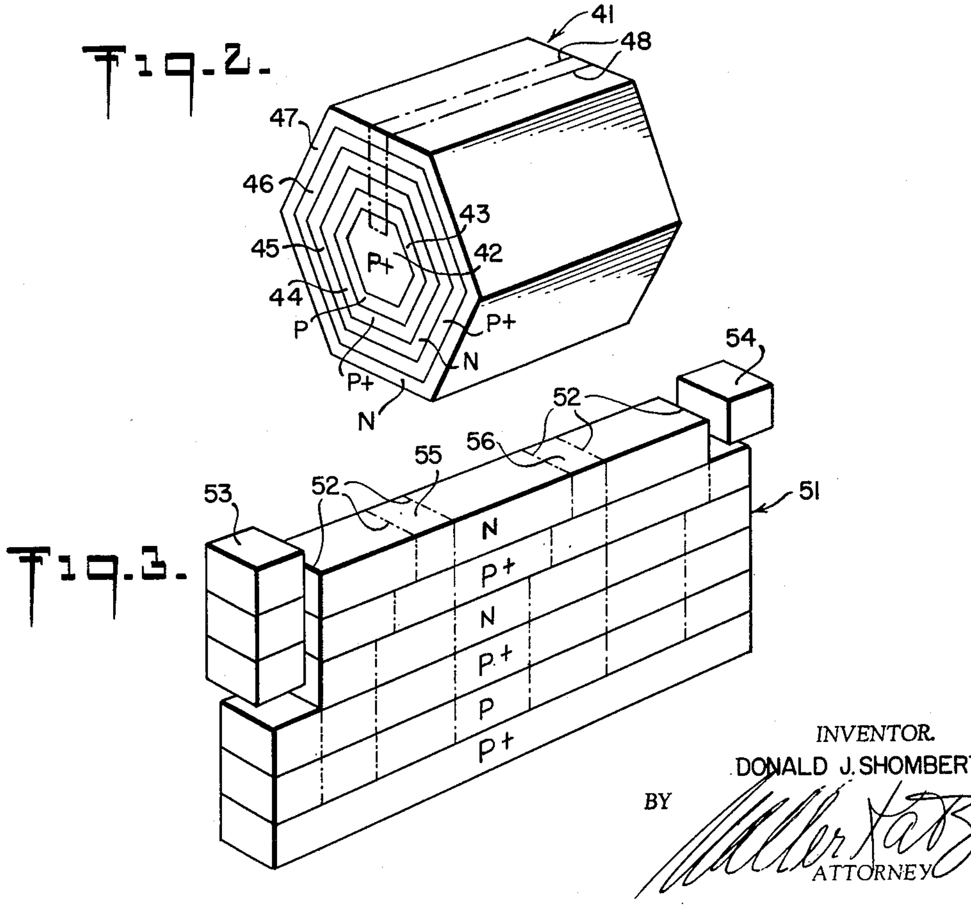
FIGURE 2 illustrates one step in the construction of a direct coupled amplifier in accordance with the present invention.
FIGURE 3 illustrates a second step in conjunction with the formation of a solid circuit direct-coupled amplifier in accordance with the present invention.

A semiconductor solid circuit direct-coupled amplifier in accordance with the present invention may be constructed from a member of substantially single crystalline semiconductor material 41 as illustrated in FIGURE 2. Such a member of semiconductor material may be formed in accordance with the teachings of patent application Serial No. 27,938, filed May 9,1960, by John E. Allegretti and James Lago, which is assigned to the assignee of the present application. As is disclosed in the Allegretti et al. application, silicon semiconductor material along with a first predetermined concentration of active impurity material is deposited upon a heated essentially single crystal semiconductor starting element from a decomposable source thereof in a reaction chamber. After a predetermined period of time during which the desired thickness of semiconductor material has been deposited, the reaction chamber is flushed with gas to remove unwanted atoms of active impurity material therefrom. Thereafter, additional semiconductor decomposable source material and atoms of active impurity material of a desired type and second predetermined concentration are introduced into the reaction chamber and an additional layer of desired thickness of semiconductor material is deposited in essentially single crystalline form contiguous with the layer of material previously deposited. Each of the two layers are contiguous and are separated by a transition region which in some circumstances may be a P-N junction.

By referring again to FIGURE 1 and in conjunction with the description of FIGURE 2, it can therefore be seen that the core 42 of the member 41 illustrated in FIGURE 2 may be P+ type semiconductor material such as silicon, and which ultimately will provide the substrate 11 as illustrated in FIGURE 1. After the desired thickness of the core 42 has been established, the reaction chamber is flushed with a gas to remove unwanted P-type active impurity atoms which may be found therein. After a predetermined amount of the P-type active impurity atoms have been removed, additional decomposable silicon source material along with a predetermined amount of P-type active impurity material in the concentration desired to obtain the P-type conductivity required to provide the resistors 23, 21A, 21B and 21C as above described is introduced into the reaction chamber. By so doing, a layer 43 of P-type semiconductor silicon is deposited upon the core 42. After approximately four mils of such P-type material having a resistivity of approximately 10 ohm centimeters for the specific device under consideration has been deposited, the active impurity concentration within the decomposable source material is increased to obtain a highly doped deposited silicon semiconductor material with is P+ type thus forming a low resistivity region or layer 44 adjacent to and crystallographically interconnected with the layer 43. This P+ region forms the emitters of the three transistors A, B and C above described, and also provides means for an ohmic connection to the resistor 23. The thickness of the layer of material 44 is not critical and a layer of 1 mil is reasonable.

After the layer 44 is formed, the reaction chamber is once again flushed to remove all of the unwanted P-type active impurity material. After this has been accomplished, additional decomposable source material along with atoms of an N-type impurity material is introduced into the reaction chamber to form the layer 45 of silicon semiconductor material. The layer 45 provides the base regions for the transistors A, B and C. Typically a layer of material approximately ½ mil in thickness and having a resistivity of from 2 to 5 ohm centimeters is utilized in accordance with the present invention. After the layer 45 of material is deposited, once again the reaction chamber is flushed to remove the unwanted N-type active impurity atoms and thereafter additional source material along with P-type active impurity material to provide the P+ layer 46 of semiconductor material is introduced into the reaction chamber. The P+ type layer 46 is utilized to form the collectors of the transistors A, B and C and effectively one portion of the Zener type diodes. Again a thickness of approximately 1 mil is sufficient for this purpose.

The remaining layer 47 of semiconductor material is N-type; therefore, the reaction chamber is thoroughly flushed to remove the unwanted P-type active impurity atoms. At this point, additional source material along with the desired concentration of N-type active impurity material is introduced into the reaction chamber to form the layer 47. Since the layer 47 forms a very sharp junction with the layer 46 for the purposes as above described, and since the N-type layer controls the Zener voltage drop across the junction between the layers 46 and 47, the resistivity of the layer 47 is quite critical for the particular voltage drop desired in accordance with any specific application for a semiconductor solid circuit direct-coupled amplifier in accordance with the present invention. Utilizing the parameters previously stated wherein a voltage drop of 8 volts is desired, a thickness of 1 mil for layer 47 is desired, along with a resistivity of 0.1 ohm centimeters.

After the member 41 has been formed as above described, the source material is removed from the chamber, the element 41 permitted to cool, and it is thereafter removed from the chamber. At this point a slice of material is removed from the element 41; such a slice would be as indicated by dashed lines 48. Such a structure is additionally illustrated in FIGURE 3 to which reference is hereby made.

The slice of material from the element 41 as illustrated in FIGURE 2 is shown at 51 in FIGURE 3. Such material having the various layers indicated by the conductivity thereof and arranged so as to provide the substrate 11 at the lowermost portion thereof is first cut with a diamond saw or by an abrasive stream or the like, along with the dotted lines 52. The excess layers of material at each end are removed as is illustrated at 53 and 54 by the loose layers of material. Thereafter, the intervening excess portions of the body of material 51 are removed, such excess portions being illustrated at 55 and 56. The remaining structure is then etched in accordance with well known etching techniques in the semiconductor art to provide a structure roughly as shown in FIGURE 1. This structure then has the various interconnections illustrated in FIGURE 1 applied thereto in accordance with well known bonding techniques in order to provide the completed solid circuit semiconductor direct-coupled amplifier in accordance with the present invention.

The semiconductor solid circuit structure may then be mounted upon a header or similar structure and incorporated in accordance with well known semiconductor mounting techniques. If desired the incorporated structure along with the four external resistors 24, 25, 26 and 27 may be mounted upon a terminal board, again in accordance with well known semiconductor manufacturing techniques. If such is accomplished, the entire structure may have an over-all dimension, including that of the terminal board upon which it is mounted, of approximately ½ inch wide and 1 inch in length, and with four external connections to be made, namely, the input, output, ground and the bias supply. By having the semiconductor solid circuit structure housed by being mounted upon a header and then encapsuled in accordance with well known techniques, it can readily be seen that each of the semiconductive circuit components is subjected to a uniform ambient temperature. Furthermore, since each of the emitter resistors for the transistors is constructed of silicon semiconductor material, there is an inherent temperature stabilization built into the amplifier structure.

There has thus been disclosed a semiconductor solid circuit direct-coupled amplifier which is exceedingly strong, reliable and which is compatible with the presently known microminiaturization techniques. Although three transistors have been described in the present description, it should be understood that any number of stages may be cascaded in accordance with the techniques above described in order to accomplish the desired result for any particular application. It should also be understood that although PNP transistors were described, that NPN transistors may be utilized by merely reversing the conductivity type of each of the layers and reversing the polarity of the source of direct current voltage. It should therefore be understood that although a specific direct-coupled amplifier has been disclosed herein, such has been done for purposes of description only and the scope of the present invention should be measured only by the appended claims.

What is claimed is:

1. A semiconductor solid circuit comprising a substrate of semiconductor material; at least two junction transistors each having an emitter, a collector and a base; first and second single crystalline semiconductor resistors affixed to the emitters respectively of said transistors and to said substrate; a layer of semiconductor material crystallographically interconnected to the collector of one of said transistors and forming a sharp P-N junction therewith; and a conductive connection directly between said layer and the base of the other transistors.

2. A semiconductor solid circuit in accordance with claim 1 in which said transistors, said resistors and said layer of material are each crystallographically interconnected.

3. A semiconductor solid circuit in accordance with claim 2 in which said semiconductor material is essentially single crystalline silicon semiconductor material.

4. A semiconductor solid circuit in accordance with claim 3 including means for biasing said sharp junction in a reverse bias condition to a degree sufficient to cause said junction to operate in its reversed biased Zener breakdown characteristic region.

5. A semiconductor solid circuit in accordance with claim 4 in which said biasing means includes an external resistor connected to the collector of each of said transistors and to a source of direct current potential.

6. A semiconductor solid circuit in accordance with claim 1 in which each of said transistors is a PNP type transistor and said layer of semiconductor material is N-type semiconductor material.

7. A semiconductor solid circuit direct-coupled amplifier comprising; a substrate of silicon semiconductor material having first conductivity type; a plurality of discrete regions of silicon semiconductor material crystallographically interconnected to said substrate and having said first conductivity type; a plurality of transistors each having an emitter, a collector, and a base affixed to at least a portion of said discrete regions, the emitter of each of said transistors being crystallographically interconnected to its corresponding discrete region; an individual layer of silicon semiconductor material crystallographically interconnected to the collector of at least a portion of said transistors and forming a sharp P-N junction therewith; and biasing means connected to each of said collectors for reverse biasing the collector base junction of said transistors and for reverse biasing said sharp P-N junction into its Zener breakdown region; a direct electrical connection between each of said layers and the base of another transistor; and means for applying an input signal to a first one of said transistors whereby said signal is coupled only through said reverse biased sharp junction and said direct connection to the base of said another transistor.

References Cited in the file of this patent

UNITED STATES PATENTS

| | | |
|---|---|---|
| 3,040,195 | Jones et al. | June 19, 1962 |
| 3,083,302 | Rutz | Mar. 26, 1963 |